(12) United States Patent
Cheng et al.

(10) Patent No.: US 8,256,930 B2
(45) Date of Patent: Sep. 4, 2012

(54) LIGHT-EMITTING DIODE MODULE WITH A REFLECTING PORTION HAVING TWO INCLINED PLANES OPPOSITE TO EACH OTHER

(75) Inventors: Shun-Chung Cheng, Sindian (TW);
Hsiu-Tsu Wang, Jhonghe (TW);
Chih-Lung Liang, Taipei (TW);
Chia-Hao Wu, Taipei (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 321 days.

(21) Appl. No.: 12/689,399

(22) Filed: Jan. 19, 2010

(65) Prior Publication Data
US 2010/0308346 A1  Dec. 9, 2010

(30) Foreign Application Priority Data
Jun. 4, 2009  (CN) .......................... 2009 1 0040071

(51) Int. Cl.
*F21V 9/00*  (2006.01)
(52) U.S. Cl. ......................................... 362/307; 257/88

(58) Field of Classification Search ..................... 257/88; 362/307
See application file for complete search history.

(56) References Cited

U.S. PATENT DOCUMENTS

| | | | | |
|---|---|---|---|---|
| 4,698,730 A | * | 10/1987 | Sakai et al. | 362/311.05 |
| 6,582,103 B1 | * | 6/2003 | Popovich et al. | 362/307 |
| 2005/0129358 A1 | * | 6/2005 | Minano et al. | 385/31 |

* cited by examiner

*Primary Examiner* — Thomas L Dickey
(74) *Attorney, Agent, or Firm* — Li & Cai Intellectual Property (USA) Office (57) ABSTRACT

A light-emitting diode module includes a transparent base, a support and a plurality of light-emitting chips. The base has a plurality of cavities separated from each other by a predetermined distance in order to respectively receive the light-emitting chips to form light-exiting areas. The base has a reflecting portion opposite to the cavities. The reflecting portion is at least one inclined plane for reflecting light that have projected outside walls of the cavities to the peripheral area of the light-emitting areas in order to increase the uniformity of the light source. In addition, the light-emitting chips are arranged to form a line or surface light source of any sizes by adjusting the numbers of the cavity and the light-emitting chips.

13 Claims, 6 Drawing Sheets

LIGHT-EMITTING DIODE MODULE WITH A REFLECTING PORTION HAVING TWO INCLINED PLANES OPPOSITE TO EACH OTHER

BACKGROUND OF THE INVENTION

1. Field of the Invention

The present invention relates to a light-emitting diode, in particular, to a light-emitting diode and a module thereof using cavity and inclined plane that are disposed on two opposite sides of a base in order to increase light-emitting efficiency.

2. Description of Related Art

In the prior art, many light-emitting diodes are electrically arranged on a PCB by reflow soldering or wave soldering in order to generate surface light source or apply to product that requires light source. However, the manufacturing process is inconvenient and wastes a lot of time.

Figure 1:
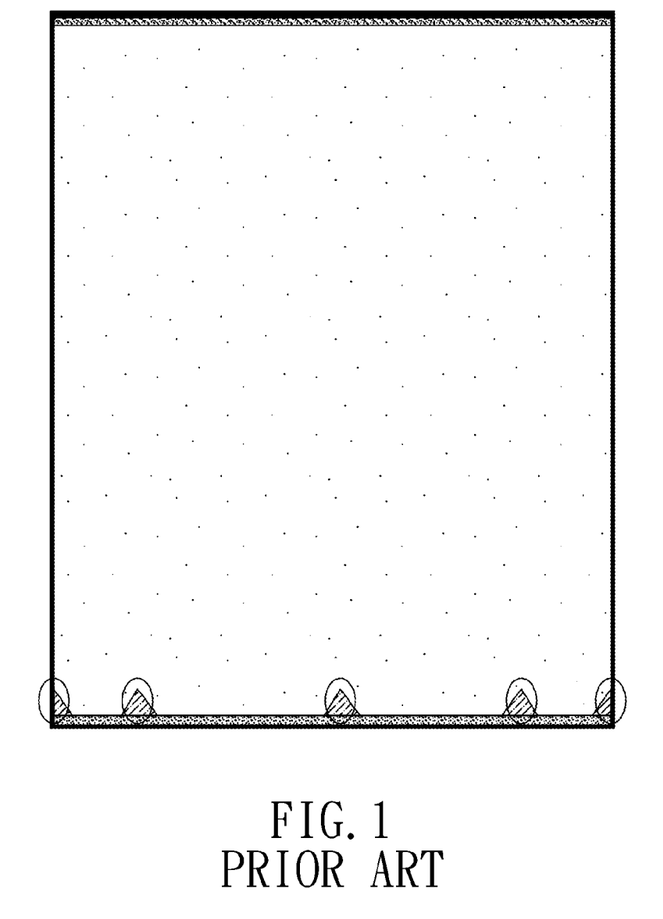
FIG. 1 is a schematic view of the light source of the light-emitting diode generating hot spot according to prior art.

Moreover, the optic property and the usage life of the light-emitting diodes would be decreased by heat during reflow soldering or wave soldering process. In addition, light source generated by prior structure with the light-emitting diodes are non-uniform due to hot spot as shown in FIG. 1.

SUMMARY OF THE INVENTION

In view of the aforementioned issues, the present invention provides a light-emitting diode that includes a transparent base and a support. The base has a cavity and a reflecting portion disposed on two opposite sides thereof in order to increase light source. In addition, the size of light source can be increased by increasing the number of the cavity.

To achieve the above-mentioned objectives, the present invention provides a light-emitting diode, including: a transparent base, a support, a light-emitting chip and a translucent resin. The transparent base has a cavity on a first side thereof and a reflecting portion on a second side thereof, and the first side is different from the second side. The support and the reflecting portion are disposed on the second side of the base. The light-emitting chip is disposed in the cavity of the base and electrically connected to the support. The translucent resin is combined with the base for packaging the light-emitting chip.

Therefore, the present invention can arrange the light-emitting chips to form a line or surface light source of any sizes by adjusting the numbers of the cavity and the light-emitting chips.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

In the following detailed description of the present invention, the similar elements use the same label.

Figure 2:
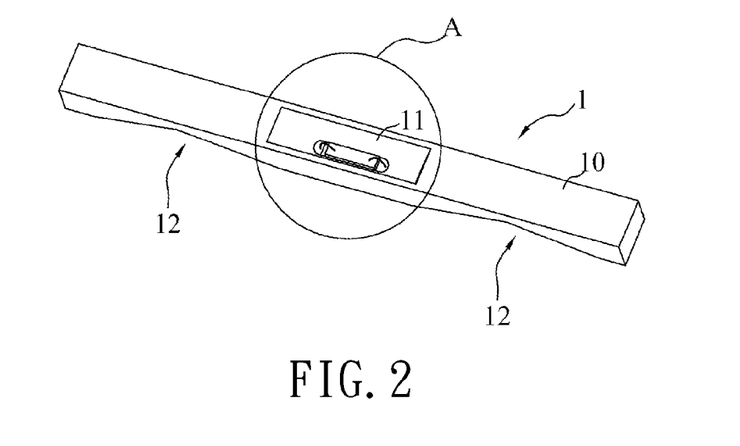
FIG. 2 is a perspective view of the light-emitting diode according to one of the best embodiments of the present invention.
Figure 3:
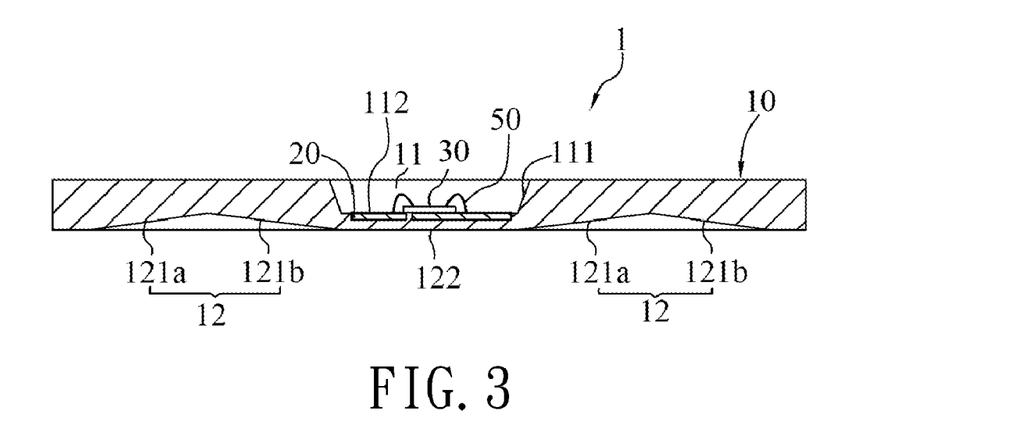
FIG. 3 is a cross-sectional view of the light-emitting diode according to one of the best embodiments of the present invention.
Figure 4:
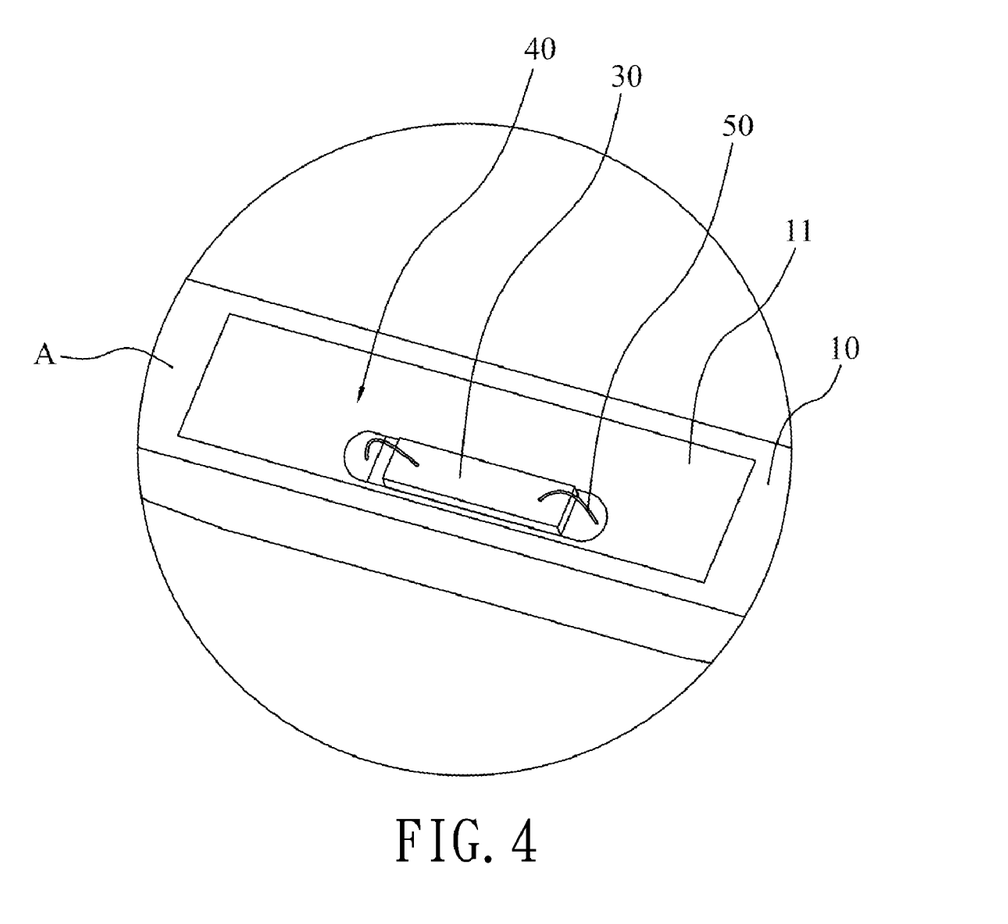
FIG. 4 is an enlarged view of A part in FIG. 2.

Referring to FIGS. 2 to 4, one of the best embodiments of the present invention provides an LED (Light-emitting diode) 1, including a support 20, a light-emitting chip 30, a base 10 and a translucent resin 40 combined with the base 10 for packaging the light-emitting chip 30.

The base 10 is made of transparent material and is a strip shape structure. The base 10 has a cavity 11 formed on the first side (such as top surface) thereof. The shape of the cavity 11 is similar as a funnel that has a width gradually reduced from top to bottom. The cavity 11 has an annular wall 111 and a plane bottom portion 112. The base 10 has a plurality of reflecting portions 12 formed on the second side (such as bottom surface) opposite to the first side which the cavity 11 disposed on. Each of the reflecting portions 12 is composed of at least one inclined plane, such as 121a and 121b. The cavity 11 is disposed on a geometric center position of any two adjacent reflecting portions 12 that are arranged along a longwise direction. In other words, the inclined planes of the corresponding reflecting portions 12 oblique laterally outwardly depending on the position of the corresponding light-emitting chip 30 in order to reflect light emitted from light-emitting chip 30 that have passed through the base 10. In the present embodiment, there are a first and a second reflecting portion 12 disposed beside two opposite sides of the cavity 11. Each of the reflecting portions 12 has two inclined planes 121a, 121b disposed on a bottom side (the second side) of the base 10, opposite to each other and connected to each other to form an included angle.

As shown in FIG. 3, the inclined plane 121a of the first reflecting portion 12 on the left side of the cavity 11 and the inclined plane 121b of the second reflecting portion 12 on the right side of the cavity 11 respectively extend to the first side (top surface) but opposite direction according to the position of the cavity 11 of the base 10 or the position of the light-emitting chip 30. So the inclined plane 121b of the first reflecting portion 12 on the left side of the cavity 11 and the inclined plane 121a of the second reflecting portion 12 on the right side of the cavity 11 respectively extend to the second side (bottom surface) but opposite direction according to the position of the cavity 11 of the base 10 or the position of the light-emitting chip 30. That is to say, the inclined planes 121a, 121b of the first reflecting portion 12 on the left side of the cavity 11 and the inclined planes 121b, 121a of the second reflecting portion 12 on the right side of the cavity 11 respectively extend laterally outwardly according to the position of the cavity 11 of the base 10 or the position of the light-emitting chip 30. The support 20 has a chip-mounting area disposed in the cavity 11, and the light-emitting chip 30 is disposed on the chip-mounting area of the cavity 11. The light-emitting chip 10 has two electrode pads (not shown) respectively electrically connected to two conductive arms (not shown) of the support 20 via two metal conductive lines 50 by a wire-bonding process.

The translucent resin 40 is filled into the cavity 11 for packaging the light-emitting chip 30 so as to define a light-exiting area A in the cavity 11. In addition, the translucent resin 40 may be made of optical material with high transparency, such as epoxy, silicone etc., in order to increase light transmitting efficiency of the present invention. Furthermore, one part of light with a first wavelength emitted from the light-emitting chip 30 may be converted into light with a second wavelength so that the converted light with the second wavelength and the unconverted light with the first wavelength are mixed to form white light by utilizing the translucent resin 40 with phosphor and the high transparency optical material such as epoxy, silicone etc.

According to the above-mentioned description, the number of the light-emitting chip 30 is at least one. Hence, the number of the light-emitting chip 30 is equal to one or is larger than one according to different brightness requirements.

Furthermore, when the number of the cavity is increased, the present invention can provide a light-emitting diode module. In addition, the present invention can show light-emitting area of any size by arranging the light-emitting diode modules.

Figure 5:
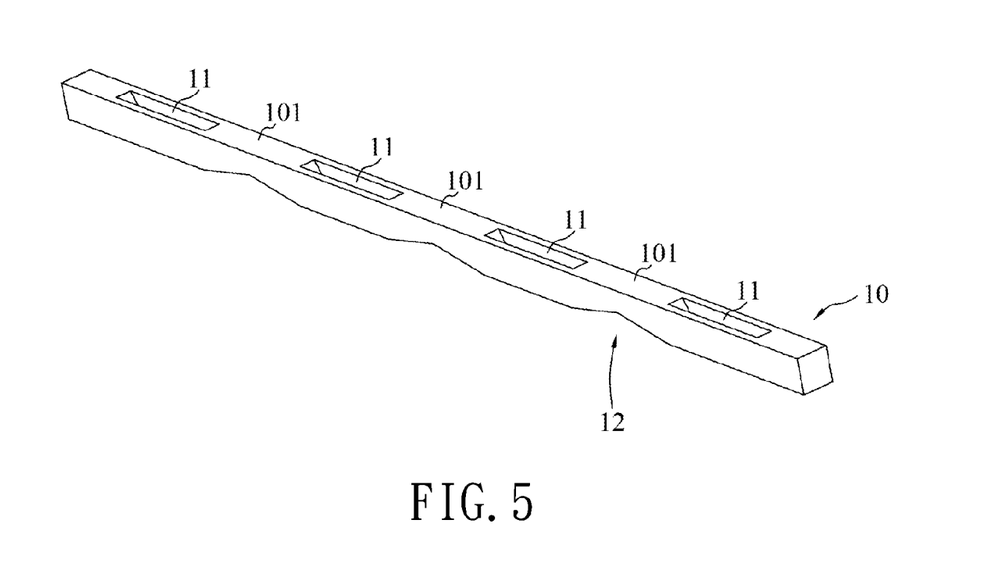
FIG. 5 is a perspective view of the light-emitting diode module according to one of the best embodiments of the present invention.
Figure 6:
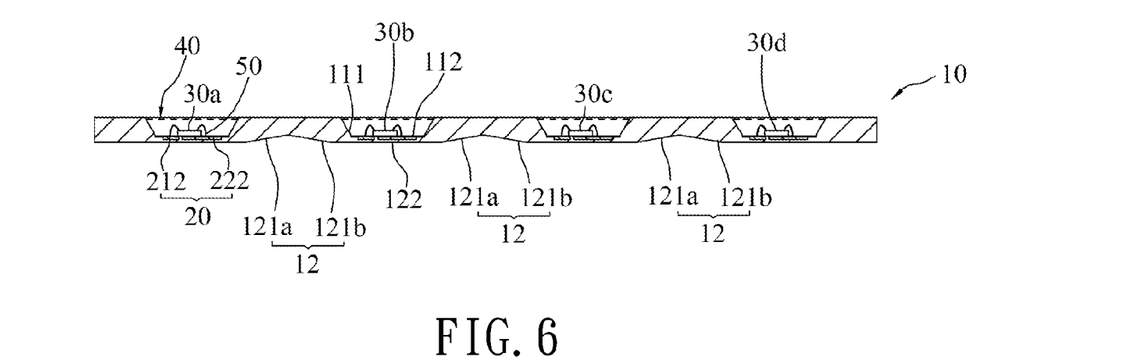
FIG. 6 is a cross-sectional view of the light-emitting diode module according to one of the best embodiments of the present invention.
Figure 7:
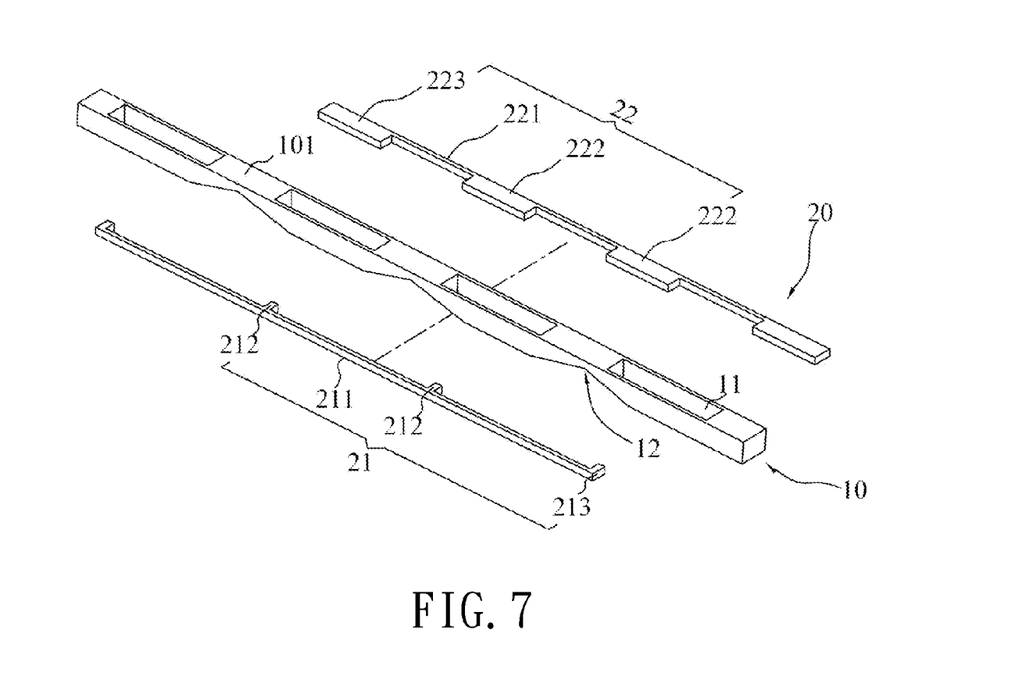
FIG. 7 is a perspective, exploded view of the support unit of the light-emitting diode module according to one of the best embodiments of the present invention.

Referring to FIGS. 5-7, one of the best embodiments of the present invention provides a light-emitting diode module, including: a support unit and at least two light-emitting chips 30. The support unit has a support 20 and a base 10 combined with the support 20. The support 20 has a first conductive arm 21 and a second conductive arm 22 as shown in FIG. 7. The conductive arms 21, 22 may be made of metal conductive material or flexible conductive material, such as copper, platinum, aluminum or iron etc. In the present embodiment, the first conductive arm 21 and the second conductive arm 22 are disposed on the same level and are separated parallelly from each other. The first conductive arm 21 has a first body 211 with a strip shape and a plurality of first projecting pieces 212 extended from the first body 211, paralleled each other and facing towards the second conductive arm 22. The second conductive arm 22 has a second body 221 with a strip shape and a plurality of second projecting pieces 222 extended from the second body 221, paralleled each other and facing towards the first conductive arm 21. Each first projecting piece 212 and each second projecting piece 222 are separated from each other to form a gap (not shown). In addition, the end 213 of the first body 211 and the end 223 of the second body 221 are separated by a predetermined distance and are respectively connected to a positive electrode and a negative electrode of an external power in order to provide power to the light-emitting chips 30.

Referring to FIG. 6, the support 20 has at least two chip-mounting areas respectively disposed in the two corresponding cavities 11, and at least two light-emitting chips 30 are respectively disposed on the corresponding chip-mounting areas. In the present embodiment, four light-emitting chips 30a, 30b, 30c, 30d are mounted on the second projecting pieces 222 and are adjacent to the first projecting pieces 212, and each light-emitting chip is electrically connected to each corresponding first projecting piece 212 and each corresponding second projecting piece 222. The end 213 of the first body 211 and the end 223 of the second body 221 are respectively connected to a positive electrode and a negative electrode of an external power in order to electrically connect the light-emitting chips 30 with each other in series.

The number (N) of the light-emitting chips is at least the same as the number (M) of the cavities. In other words, the number of the light-emitting chips is equal to or larger than the number of the cavities (N☐M). The number of the light-emitting chips in each cavity is equal to or larger than one (N☐1).

Referring to FIGS. 5-7, the base 10 combines with the support 20 and covers the support 20. The base 10 is a transparent structure with a strip shape. The base 10 has at least two cavities 11 concaved inwards from the top side thereof and separated from each other and a plurality of connection sections 101 for connecting the cavities 11 to form the light-emitting diode module. The number of the connection sections is (N−1) less than the number (N) of the cavities. Each cavity 11 has an annular wall 111 and a plane bottom portion 112 for disposing each corresponding light-emitting chip 30a (or 30b, 30c, 30d), and the wall 111 has a width gradually reduced from the top side of the base 10 to the plane bottom portion 112. In the other word, the area of the top of the opening defined by the wall 111 and the plane bottom portion is larger than the area of the bottom of the opening. The reflecting portions 12 are respectively located on the positions of the connection sections 101 of the base 10 and opposite to the cavities 11. Each reflecting portion 12 is composed of at least one inclined plane (121a or 121b) that is between two adjacent cavities 11 and corresponds to the connection section 101.

Referring to FIG. 6, each reflecting portion 12 is composed of two inclined planes 121a, 121b that are concavely and obliquely formed on the bottom side of the base 10 and are disposed between every two cavities 11. That is to say, the two inclined planes 121a, 121b of any one of the reflecting portions 12 respectively oblique to the direction of the corresponding adjacent cavity 11 in order to reflect light that have projected outside a wall of the corresponding cavity. In other words, any two adjacent reflecting portions 12 are connected by a connection surface 122 formed on the bottom side of the base 10, and the connection 122 and the corresponding cavity 11 are respectively disposed on two opposite sides (such as top side and bottom side) of the base 10. In addition, the translucent resins 40 are respectively filled into the cavities 11 to cover the light-emitting chips 30a, 30b, 30c and 30d so as to provide a plurality of light-exiting areas A of the cavities 11 arranged to form a strip light source.

Figure 8:
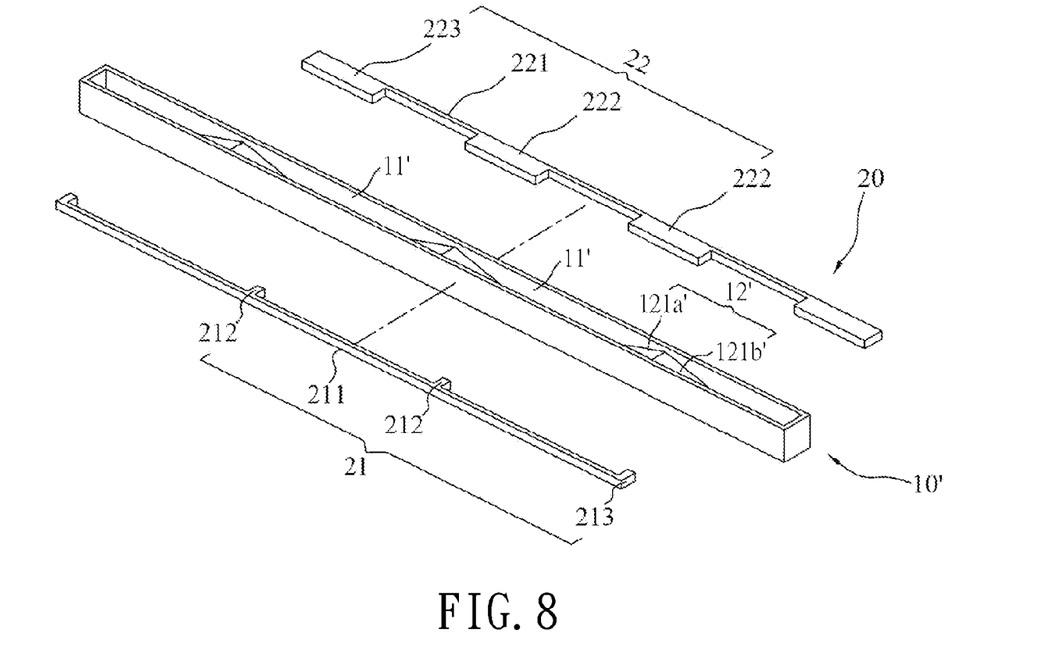
FIG. 8 is a perspective, exploded view of the support unit of the light-emitting diode module according to another best embodiment of the present invention.
Figure 9:
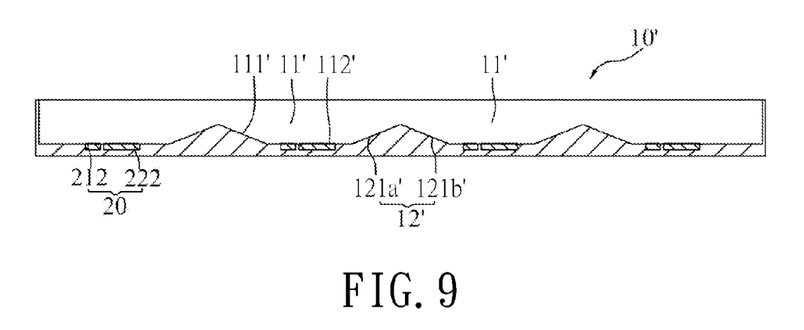
FIG. 9 is a cross-sectional view of the support unit of the light-emitting diode module according to another best embodiment of the present invention.

Referring to FIGS. 8-9, it discloses another embodiment using a base that is different from the first embodiment. The base 10' combines with the support 20 and covers the support 20. The base 10' is a long strip transparent structure. The base 10' has at least two cavities 11' concaved inwards from the top side thereof. The base 10' has at least one reflecting portion 12' projected inwards from the bottom side thereof. The reflecting portion 12' is a solid structure and the material of the reflecting portion 12' is preferred the same as the material of the base 10'. In this embodiment, each cavity 11' has an annular wall 111' and a plane bottom portion 112' for disposing each corresponding light-emitting chip, and the wall 111' is also defined by any two of the reflecting portions 12' composed of two inclined planes 121a', 121b' which oblique to bottom side of the base 10'. That is to say, the plane bottom portion 112' is surrounded by the inclined plane 121a' of one of the two adjacent reflection portions 12' and the inclined plane 121b' of another one of the two adjacent reflection portions 12' to form the cavity 11'. Thus, the wall 111' and the inclined planes 121a', 121b' of two adjacent reflections 12' are parallel to each other in one cavity. Furthermore, the translucent resins will be filled into the cavities 11' for packaging the light-emitting chips so as to form a strip light source. In addition, the cavities 11' can be communicated with each other to form a light-exiting channel. Thus, uniform light can be emitted from the light-emitting diode module.

Figure 10:
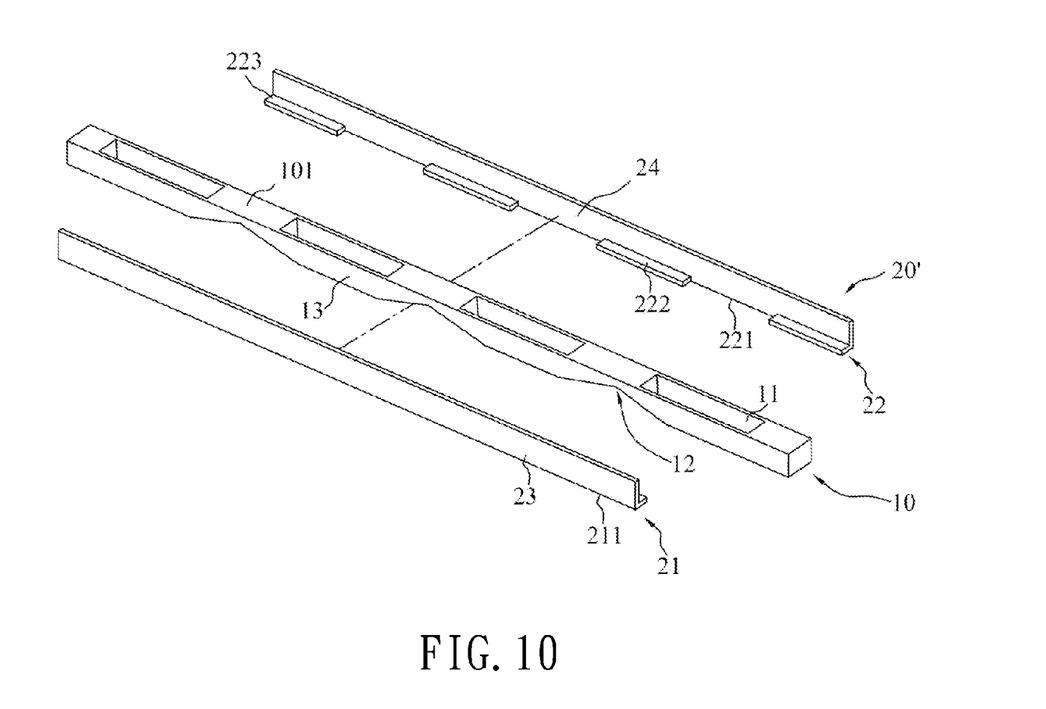
FIG. 10 is a perspective, exploded view of the support unit of the light-emitting diode module according to another best embodiment of the present invention.
Figure 11:
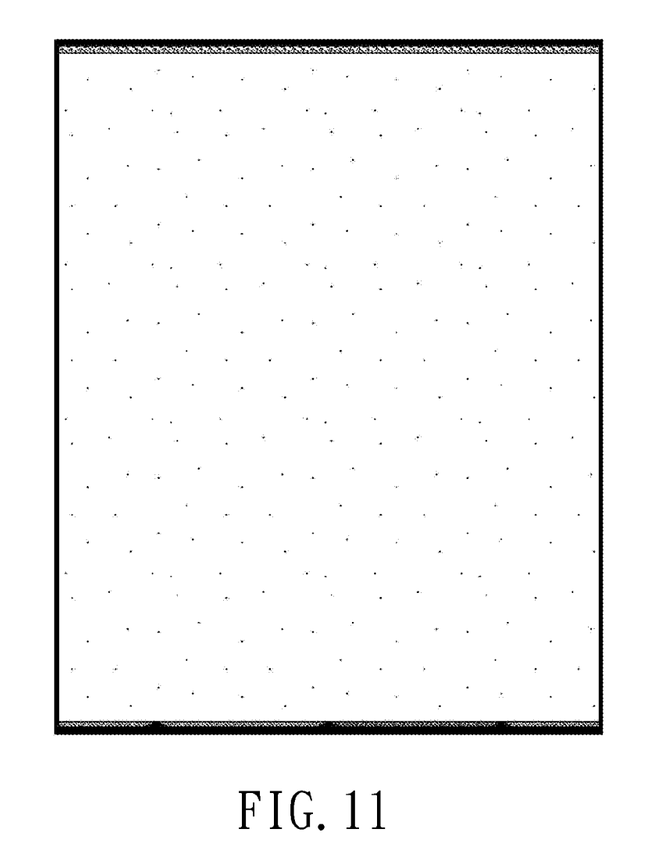
FIG. 11 is a schematic view of the light-emitting diode generating uniform light source without hot spot according to present invention.

Referring to FIG. 10, it discloses another embodiment using a support structure that is different from the first embodiment. The support 20' includes a first conductive arm 21, a second conductive arm 22, a first side wall 23 connected to the first conductive arm 21 by a predetermined included angle, and a second side wall 24 connected to the second conductive arm 22 by a predetermined included angle. In other words, the first side wall 23 and the second side wall 24 are respectively connected to the main bodies 211, 221. The first side wall 23 has a predetermined angle relative to the first projecting piece 212, and the second side wall 24 has a predetermined angle relative to the second projecting piece 222. The above-mentioned angles are determined according to the outlines of the two lateral sides 13 of the base 10. The two lateral sides 13 may be parallel to the two side walls 23, 24. When the two lateral sides 13 of the base 10 are vertical to a horizontal plane, the two side walls 23, 24 are vertical to the two projecting pieces 212, 222. The support 20' further can cover the bottom portion and the lateral side of the transparent base 10 by the design of the two side walls 23, 24 vertical to the two projecting pieces 212, 222. Hence, the light generated by the light-emitting chip can project out from the light-exiting area A and the peripheral area of the light-emitting area A by using the reflecting inclined plane, in order to uniform the light and increase the brightness as shown in FIG. 11.

In the present invention, the support 20 (20') is made by punching and cutting a support sheet. The base 10 may be formed by any forming methods. The light-emitting chips are electrically disposed on the support 20 by a wire-bonding process and the light-emitting chips are covered with the translucent resin 40. In addition, the present invention may be cut into a single LED package structure as shown in FIG. 1 or may be cut into two, three or more connected LED package structures as shown in FIG. 5.

Figure 12:
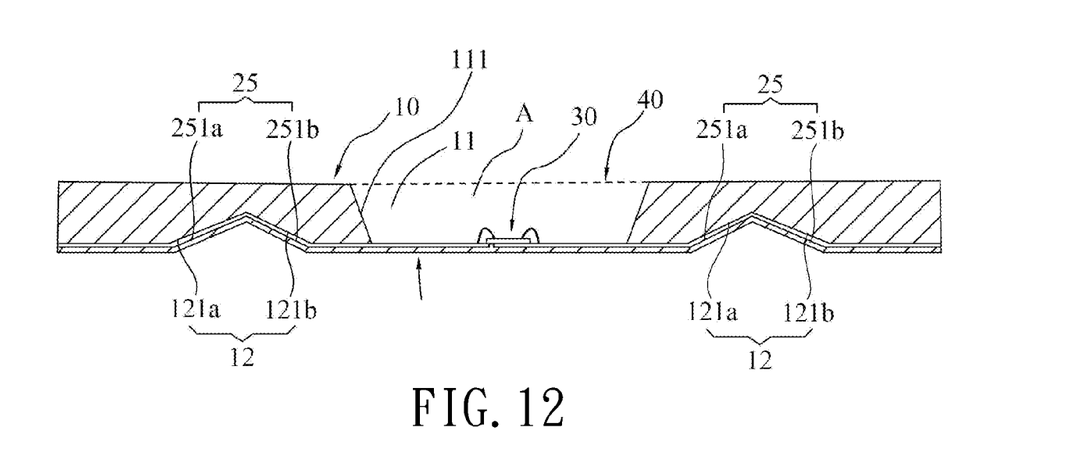
FIG. 12 is a schematic view of the inclined planes of the support mated with the reflecting portions of the base according to present invention.

Moreover, referring to FIG. 12, at least one inclined portion 25 of the support 20 (20') is prepared as a part of the reflecting portion 12 (12') of the base 10 (10') to an LED (Light-emitting diode) or a light-emitting diode module. The inclined portion 25 is preformed firstly to satisfy the requirement of reflective function of the base 10 (10') during defining the profile of the support 20 (20'). Thus, the inclined portion 25 composed of two reflective planes 251a, 251b may be similar to or mated with the profile or design of the reflecting portion 12 (12') of the base 10 (10'). The reflective planes 251a, 251b of the inclined portion 25 oblique laterally outwardly depending on the position of the corresponding light-emitting chip 30 in order to reflect light that have projected outside a wall of the corresponding cavity. Referred to FIGS. 7-8, the first projecting pieces 212 and the second projecting pieces 222 of the support 20 (20') may be bent and then formed as the inclined portion 25. Every two inclined portions 25 may be respectively disposed beside two opposite sides of the light-emitting chip 30. After forming the support 20 (20') with the inclined portions 25, the base 10 (10') is formed. Next, the light-emitting chip 30 is electrically disposed on the support 20 (20') by wire bonding, and then the translucent resin 40 is filled in the cavity 11 thus the light-emitting chip 30 are packaged in the cavity 11. The base 10 (10') is transparent and the support 20 (20') with the inclined portion 25 as the function of the reflecting portion 12 (12') under the base 10 (10') that is made of metal material, so that light generated by the light-emitting chip 30 not only project onto the annular wall 111 to form a light-exiting area A, but also the light may pass through the wall 111 and be reflected upwards by the reflective planes 251a, 251b and/or the inclined planes 121a, 121b. The light of the light-exiting area A and the light reflected by the inclined planes are projected towards the same direction in order to generate uniform light source projected from the base 10.

In conclusion, the number of the cavity 11 may be one or more than one according to the number of the light-emitting chip 30. Hence, when the number of the cavity 11 is increased, the number of the light-emitting chip 30 is increased. In addition, the present invention can arrange the light-emitting chips 30 to form a line or surface light source of any sizes. Moreover, the present invention not only provides light source of different sizes and intensities, but also the present invention may solve hot spot problem of the prior art in order to obtain high light-emitting efficiency.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A light-emitting diode, comprising:
    a transparent base having a cavity on a first side thereof and a reflecting portion on a second side thereof, wherein the first side is different from the second side, wherein the reflecting portion has two inclined planes opposite to each other, and each of the inclined planes obliques laterally outwardly depending on the position of the light-emitting chip;
    a support, wherein the support and the reflecting portion are disposed on the second side of the base;
    a light-emitting chip disposed in the cavity of the base and electrically connected to the support; and
    a translucent resin combined with the base for packaging the light-emitting chip.

2. The light-emitting diode according to claim 1, wherein the support has an inclined portion as the reflecting portion of the base.

3. The light-emitting diode according to claim 2, wherein the inclined portion is mated with the reflecting portion of the base.

4. The light-emitting diode according to claim 1, wherein the reflecting portion is at least one inclined plane, and the inclined plane obliquely faces the cavity in order to reflect light that have passed through the base.

5. The light-emitting diode according to claim 1, wherein the support has a first conductive arm and a second conductive arm respectively electrically connected to two electrodes of the light-emitting chip.

6. The light-emitting diode according to claim 5, wherein the support further has two side walls vertically connected to the first conductive arm and the second conductive arm, respectively.

7. A light-emitting diode module, comprising:
- a support unit having a transparent base and a support, wherein the base has two cavities and a reflecting portion respectively disposed on two opposite side thereof, and the support and the reflecting portion are disposed on the same side of the base, wherein the reflecting portion is at least two inclined planes, and the inclined planes respectively oblique to the direction of the corresponding cavity in order to reflect light that have projected outside a wall of the corresponding cavity;
- at least two light-emitting chips respectively disposed in the cavities of the base, wherein each light-emitting chip has electrodes electrically connected to the support; and
- a translucent resin combined with the base for packaging the light-emitting chips.

8. The light-emitting diode according to claim 7, wherein the support has an inclined portion as the reflecting portion of the base.

9. The light-emitting diode module according to claim 8, wherein the inclined portion is mated with the reflecting portion of the base.

10. The light-emitting diode module according to claim 7, wherein the number of the light-emitting chips is equal to or larger than the number of the cavities, and the light-emitting chips are electrically connected in series by the support.

11. The light-emitting diode module according to claim 7, wherein the support has a first conductive arm and a second conductive arm respectively electrically connected to the electrodes of the light-emitting chip.

12. The light-emitting diode module according to claim 11, wherein the support has two side walls vertically connected to the first conductive arm and the second conductive arm, respectively.

13. The light-emitting diode module according to claim 7, wherein the base further comprises at least one connection section for connecting the cavities, and the reflecting portion corresponds to the connection section.

\* \* \* \* \*